US007858405B2

(12) United States Patent
Lee et al.

(10) Patent No.: US 7,858,405 B2
(45) Date of Patent: Dec. 28, 2010

(54) PROCESS CONDITION EVALUATION METHOD FOR LIQUID CRYSTAL DISPLAY MODULE

(75) Inventors: Jeong-Yeop Lee, Daegu (KR); Hoon Choi, Incheon (KR); Young Seok Choi, Gyeonggi-Do (KR); Kwang-Sik Oh, Gyeongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 72 days.

(21) Appl. No.: 12/314,695

(22) Filed: Dec. 15, 2008

(65) Prior Publication Data

US 2009/0289655 A1 Nov. 26, 2009

(30) Foreign Application Priority Data

May 23, 2008 (KR) ..................... 10-2008-0048248

(51) Int. Cl.
*H01L 21/66* (2006.01)
*G01R 31/26* (2006.01)
*G01R 31/00* (2006.01)

(52) U.S. Cl. ........................... 438/17; 438/14; 324/770

(58) Field of Classification Search ................... 438/10, 438/14, 17, 16, 30, 795; 324/765, 770
See application file for complete search history.

(56) References Cited

U.S. PATENT DOCUMENTS

| | | | | |
|---|---|---|---|---|
| 5,594,463 | A * | 1/1997 | Sakamoto | 345/76 |
| 2002/0101395 | A1 * | 8/2002 | Inukai | 345/83 |
| 2005/0225515 | A1 * | 10/2005 | Tsuchida et al. | 345/76 |
| 2006/0038758 | A1 * | 2/2006 | Routley et al. | 345/81 |

* cited by examiner

*Primary Examiner*—Michael S Lebentritt
*Assistant Examiner*—Karen M Kusumakar
(74) *Attorney, Agent, or Firm*—McKenna Long & Aldridge LLP

(57) ABSTRACT

A process condition evaluation method for a liquid crystal display module (LCM) includes: a first step of obtaining a threshold power measuring pattern, an analysis sample for a cell bonding status in an LCD fabrication process, and obtaining a lower substrate sample by separating an upper substrate from the threshold power measuring pattern; a second step of supplying voltages on a gate pad on the lower substrate sample with sequentially increasing a voltage level by a predetermined unit by using an electrical device, and obtaining a threshold current and a threshold voltage by measuring currents at a drain pad whenever voltage increased by a predetermined unit is applied to the gate pad; and a third step of obtaining threshold power based on the threshold current and the threshold voltage, and thereby evaluating process conditions of the LCM.

5 Claims, 6 Drawing Sheets

PROCESS CONDITION EVALUATION METHOD FOR LIQUID CRYSTAL DISPLAY MODULE

The present invention relates to subject matter contained in priority Korean Application 10-2008-0048248, filed May 23, 2008, which is hereby incorporated by reference for all purposes as if fully set forth herein.

BACKGROUND OF THE INVENTION

1. Field of the Invention

The present invention relates to a method for evaluating process conditions of a liquid crystal display module (LCM) by measuring substitution characteristics of the LCM, and more particularly, to a process condition evaluation method for an LCM capable of calculating optimal process conditions based on a threshold power and a thermal resistance coefficient.

2. Discussion of the Related Art

A liquid crystal display (LCD) device, a representative device of flat display devices serves to display images by using optical anisotropy of LC. The LCD device has advantages such as a thin thickness, a small size, low power consumption, and a high picture quality.

The LCD device displays desired images by individually supplying image information to pixels arranged in the form of matrixes, and by controlling optical transmittance of the pixels. Accordingly, the LCD device is provided with an LC panel having pixels serving as a minimum unit to display images, and arranged in the form of matrixes; and a driving unit for driving the LC panel. Since the LCD device does not spontaneously emit light, it is provided with a backlight unit for supplying light to the LCD device. The driving unit includes a timing controller, a data driving portion, and a gate driving portion.

Nowadays, demands for high resolution, large size, and high picture quality of the LCD device including an LCM are required. For the high picture quality, enhanced reliability of the product against a long time use has to be implemented.

In the related art process condition evaluation method for an LCM, an LC panel is firstly fabricated, and then a complete product of an LCM is fabricated. Then, the LCM is driven for a long time (2000 hours) in high temperature and high humidity (60° C., 80%) for inferiority test, which corresponds to an inferiority test for a thin film transistor (TFT).

However, in the method, it takes much time of about 2000 hours to evaluate the product, and the number of frequencies the LCM is evaluated is increased thus to cause high costs.

Furthermore, it is difficult to obtain objectivity in evaluating the LCM due to insufficient standard data. And, it is difficult to analyze mechanisms having inferiority occurrence, and to obtain the stability for the processes.

SUMMARY OF THE INVENTION

Accordingly, the present invention is directed to a process condition evaluation method for liquid crystal display module that substantially obviates one or more of the problems due to limitations and disadvantages of the related art.

An advantage of the present invention is to provide a process condition evaluation method for a liquid crystal display (LCD) module by measuring substitution characteristics of the LCM.

Another advantage of the present invention is to provide a process condition evaluation method for a liquid crystal display (LCD) module with reduced time taken to evaluate the product, and evaluation costs are reduced.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a process condition evaluation method for a liquid crystal display (LCD) module, includes: obtaining a threshold power measuring pattern, an analysis sample for a cell bonding status in an LCM fabrication process, and obtaining a lower substrate sample by separating an upper substrate from the threshold power measuring pattern; supplying voltages (0V~10V) on a gate pad on the lower substrate sample with sequentially increasing a voltage level by a predetermined unit (0.1V) by using an electrical device, and obtaining a threshold current and a threshold voltage by measuring currents on a drain pad whenever voltage increased by a predetermined unit is applied to the gate pad; and obtaining threshold power based on the threshold current and the threshold voltage, and thereby evaluating process conditions of the LCM.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which is illustrated in the accompanying drawings.

Hereinafter, a process condition evaluation method for a liquid crystal display module (LCM) according to the embodiment of the present invention will be explained in more detail with reference to FIGS. 1 to 7.

Firstly, a method for measuring threshold power by measuring substitution characteristics of an LCM will be explained in more detail.

A threshold power measuring pattern 11, an analysis sample for a cell bonding status in an LCM fabrication process is prepared (SA1). Then, an upper substrate including a color filter layer, and a lower substrate including a thin film transistor (TFT) are separated from each other, thereby obtaining a lower substrate sample 12 (SA2).

Then, the lower substrate sample 12 is disposed in an alignment layer stripper solution (PI stripper) for a predetermined time (e.g., five minutes), thereby having an alignment layer removed therefrom (SA3).

Then, the PI stripper is removed by using deionized water (DI), and the DI on the surface of the lower substrate sample 12 is moved by using an air gun (SA4, SA5). For your reference, time taken to remove the DI on the surface of the lower substrate sample 12 by using an air gun is about 30 seconds.

Steps (SA3~SA5) are performed so as to remove an alignment layer and DI from the lower substrate sample 12 having been separated from an upper substrate. When a thin film transistor (TFT) rather than a cell is completed, the steps (SA3~SA5) are omitted.

Then, the lower substrate sample 12 undergoes an annealing process for 30 minutes in an oven of 180~230° C., and then is exposed to a room temperature for 30 minutes (SA6, SA7).

Then, voltages (0V~10V) are supplied, by an electrical device, onto a gate pad (PAD2) on the lower substrate sample 12 with being sequentially increased by a predetermined unit of 0.1V (SA8). Here, currents (I) of a drain pad (PAD1) on the lower substrate sample 12 are measured by the electrical device (SA9).

Figure 3:
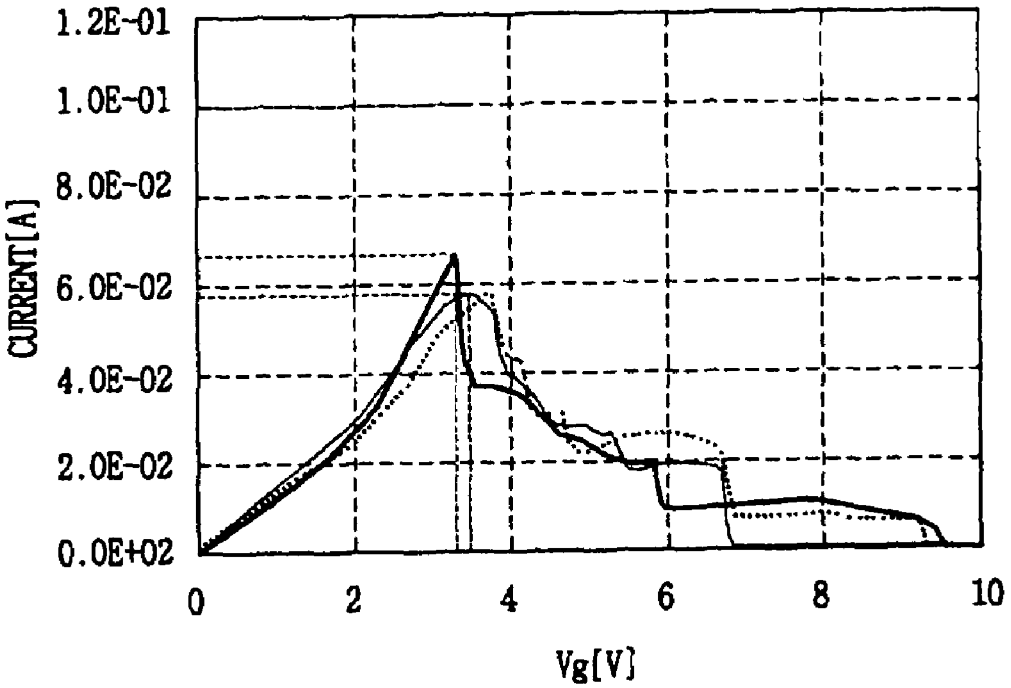
FIG. 3 is a graph showing a threshold current according to the embodiment the present invention.
Figure 4:
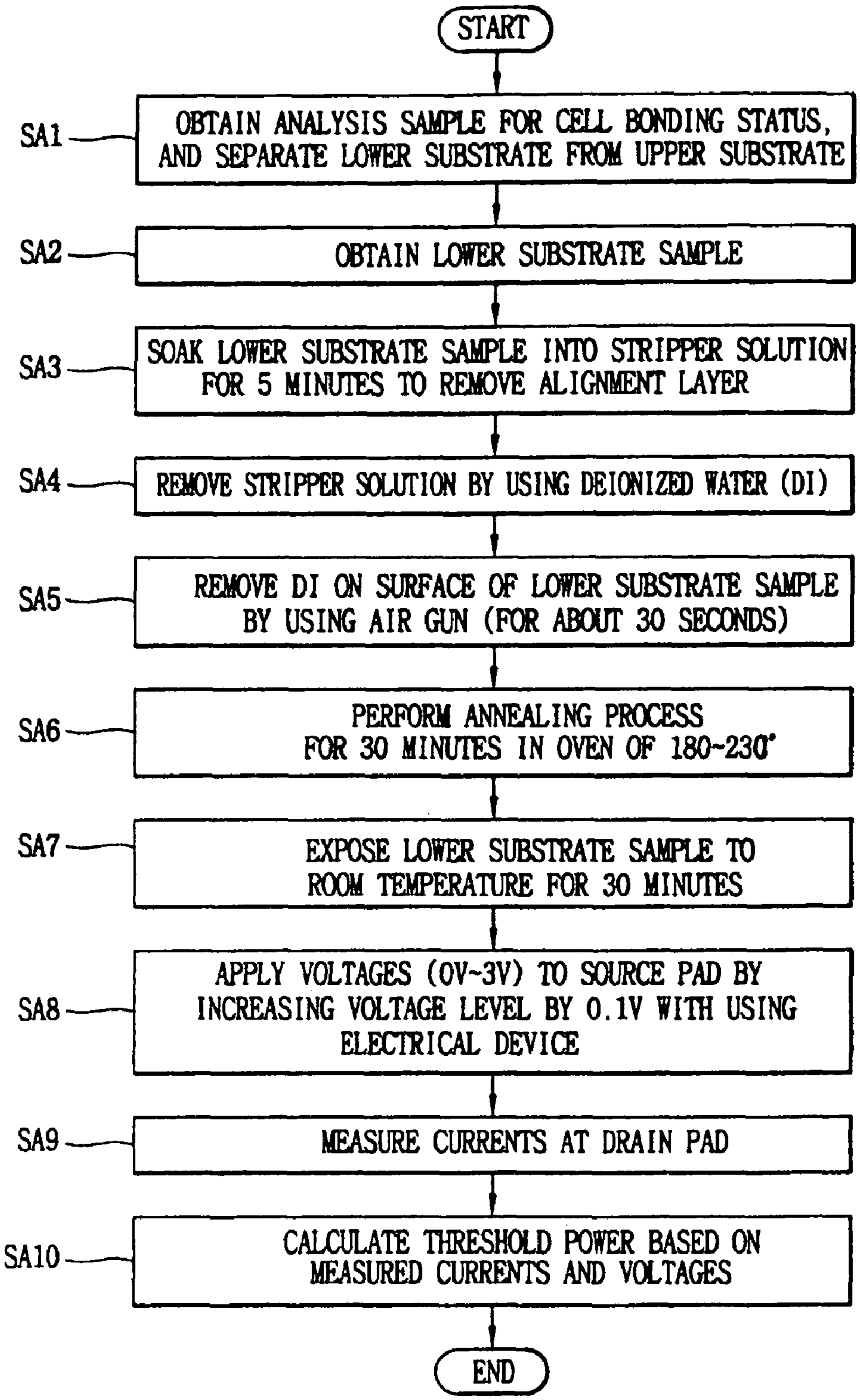
FIG. 4 is a flowchart showing processes for measuring threshold power so as to evaluate process conditions of an LCM according to the embodiment of the present invention.
Figure 5:
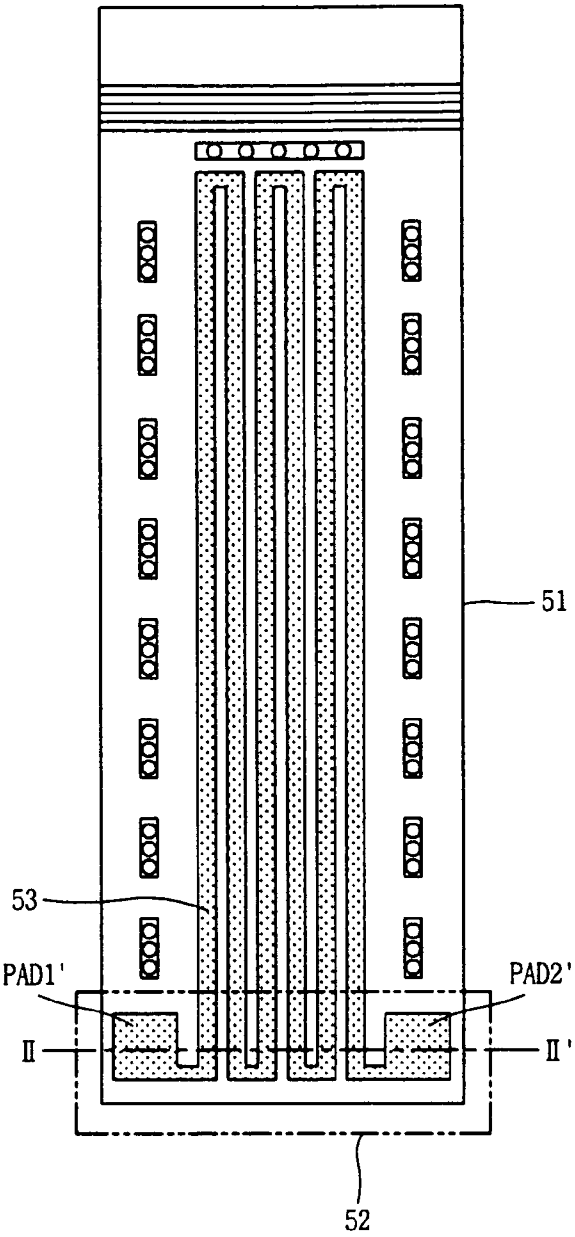
FIG. 5 is an exemplary view showing a thermal resistance coefficient measuring pattern according to the embodiment of the present invention.
Figure 6:
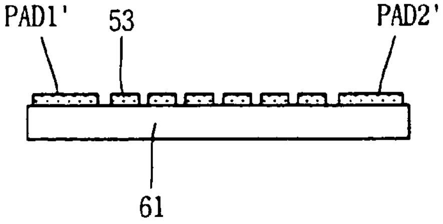
FIG. 6 is a sectional view taken along line 'II-II'' in FIG. 5.
Figure 7:
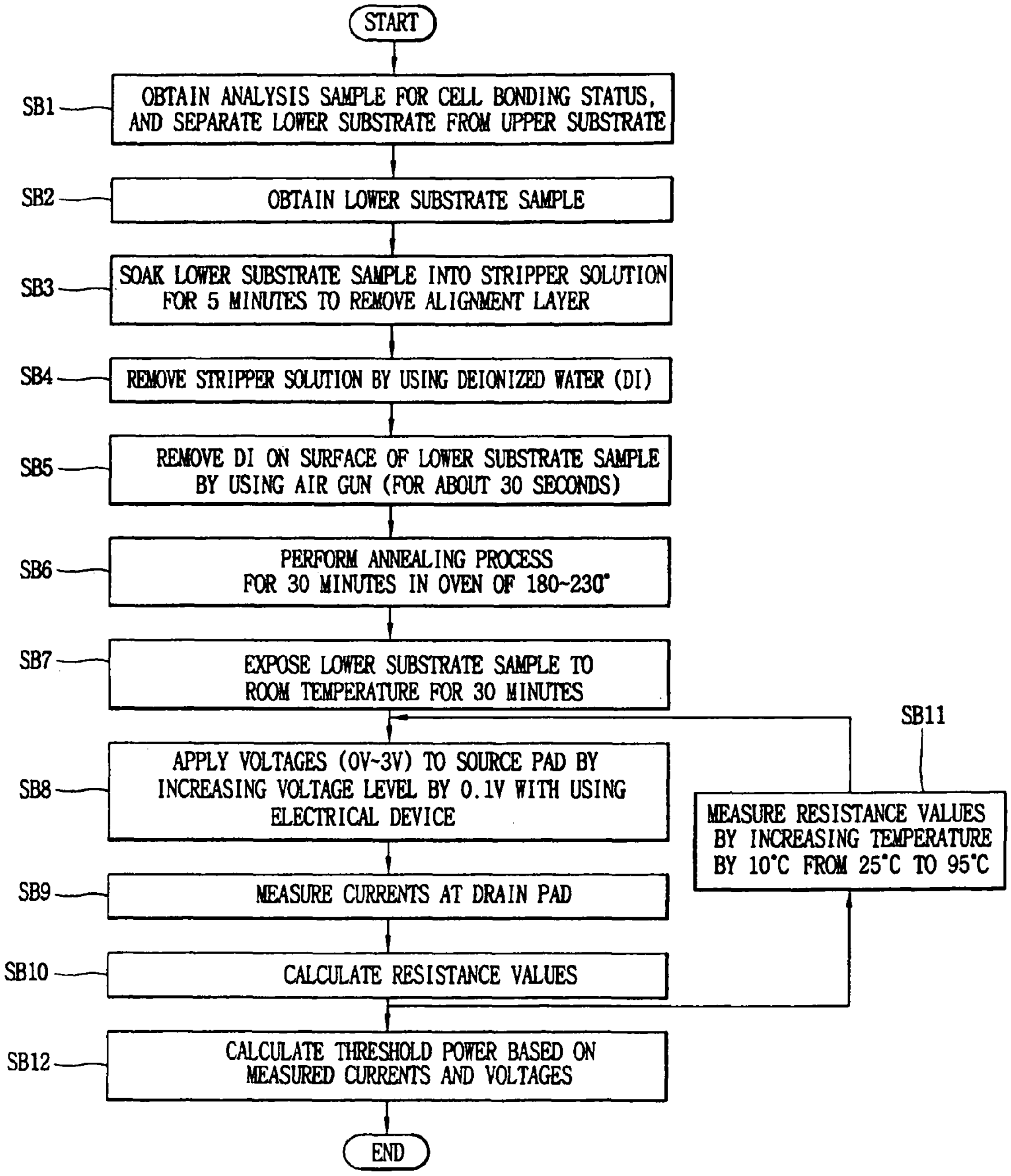
FIG. 7 is a flowchart showing processes for measuring a thermal resistance coefficient so as to evaluate process conditions of an LCM according to the embodiment of the present invention.

FIG. 3 is a graph showing a threshold current measured by supplying voltages of 0V~10V onto the gate pad (PAD2) on the lower substrate sample 12 by sequentially increasing a voltage level by 0.1V.

Figure 1:
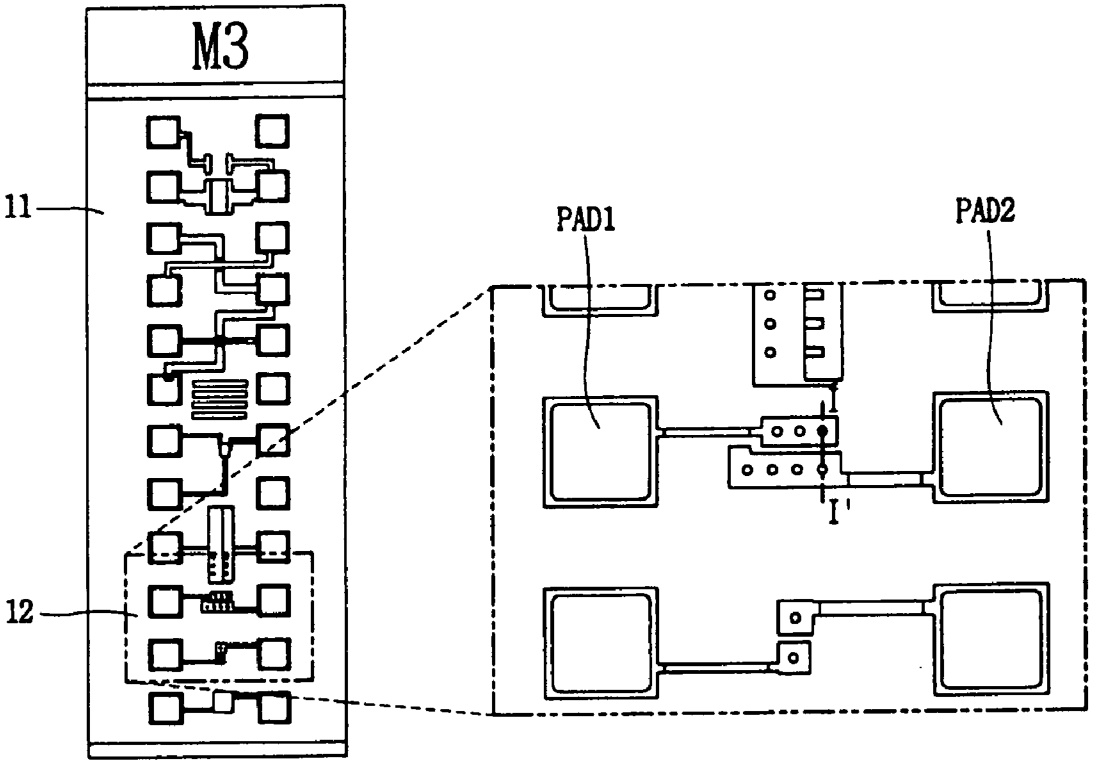
FIG. 1 is an exemplary view showing a threshold power measuring pattern according to an embodiment of the present invention.
Figure 2A:
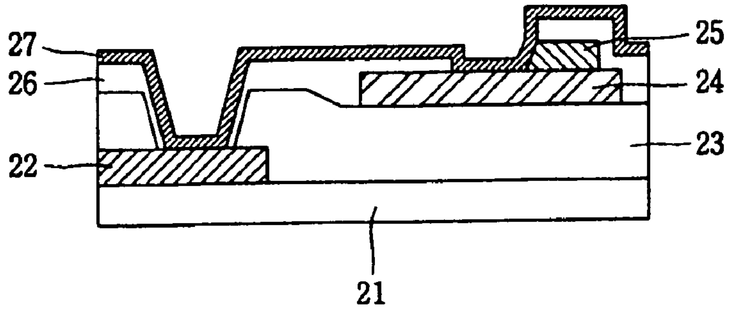
FIG. 2A is a sectional view taken along line 'I-I'' in FIG. 1.
Figure 2B:
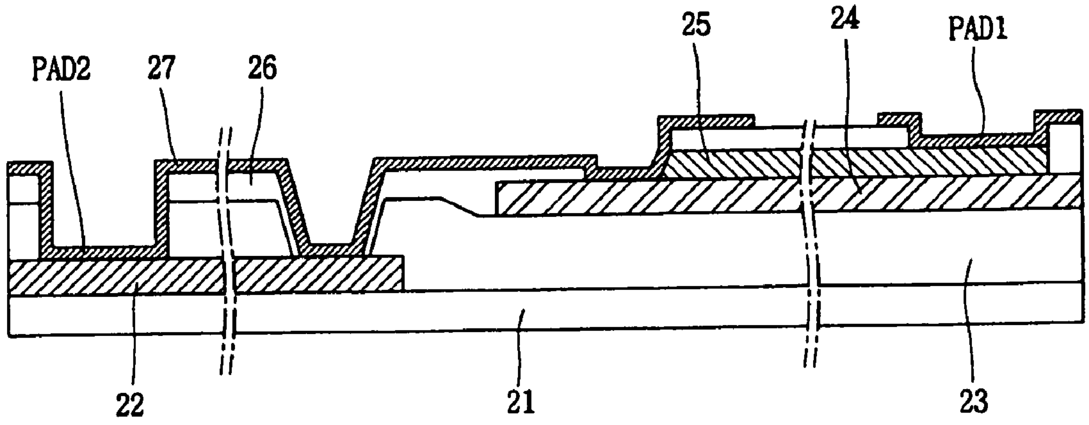
FIG. 2B is a sectional view taken along a line including the 'I-I'' and extended from the 'I-I'' in FIG. 1.

The gate pad (PAD2) is connected to a gate electrode 22 of FIG. 2, and the drain pad (PAD1) is connected to a drain electrode 25.

Then, based on the obtained threshold current and the corresponding threshold voltage, threshold power (P) is calculated by the following equation 1 (SA10).

$$P=(I\times V)/2 \qquad \text{[Equation 1]}$$

For instance, in a case that voltages of 0V~10V are supplied onto the gate pad (PAD2) on the lower substrate sample 12 by being sequentially increased by 0.1V, if the drain pad (PAD1) has a current (I) of 10 mA, the drain pad (PAD1) has a threshold voltage of 10V and a threshold current of 10 mA. Accordingly, the threshold power is maximized as '(0.01×10)/2=0.05'.

As another instance, in a case that voltages (0V~8V) are supplied onto the gate pad (PAD2) on the lower substrate sample 12 by being sequentially increased by 0.1V, if the drain pad (PAD1) has a current (I) of 8 mA, and no current (I) is detected from the drain pad (PAD1) due to 'gate open', the drain pad (PAD1) has a threshold voltage of 8V and a threshold current of 8 mA. Here, the threshold power is calculated as '(0.008×8)/2=0.032'.

The higher the threshold power is, the more excellent the lower substrate sample 12 is. This means that fabrication process conditions for the LCM are more excellent.

Hereinafter, a method for obtaining a thermal resistance coefficient by measuring substitution characteristics of the LCM according to another embodiment of the present invention will be explained.

A thermal resistance coefficient measuring pattern 51, an analysis sample for a cell bonding status in an LCM fabrication process is prepared (SB1). Then, an upper substrate including a color filter layer, and a lower substrate including a thin film transistor (TFT) are separated from each other, thereby obtaining a lower substrate sample 52 (SB2).

Then, the lower substrate sample 52 is disposed in an alignment layer stripper solution (PI stripper; poly imide stripper) for a predetermined time (e.g., five minutes), thereby having an alignment layer removed therefrom (SB3).

Then, the PI stripper is removed by using deionized water (DI), and the DI on the surface of the lower substrate sample 52 is moved by using an air gun (SB4, SB5). For your reference, time taken to remove the DI on the surface of the lower substrate sample 52 by using an air gun is about 30 seconds.

Steps (SB3~SB5) are performed so as to remove an alignment layer and DI from the lower substrate sample 52 having been separated from an upper substrate. When a thin film transistor (TFT) rather than a cell is completed, the steps (SB3~SB5) are omitted.

Then, the lower substrate sample 52 undergoes an annealing process for 30 minutes in an oven of 180~230° C., and then is exposed to a room temperature for 30 minutes (SB6, SB7).

Then, at a predetermined temperature (e.g., 25° C.), voltages (0V~3V) are supplied, by an electrical device, onto a gate pad (PAD2') on the lower substrate sample 52 with being sequentially increased by a predetermined unit of 0.1V (SB8). Here, each current (I) of a drain pad (PAD1') on the lower substrate sample 52 is measured by the electrical device (SB9). Whenever the voltages increased by 0.1V are supplied, each resistance (R) of the lower substrate sample 52 is obtained based on the voltages and the currents by using a formula (R=E/I). Here, an average (e.g., R1) of the obtained resistance values is obtained (SB10).

Then, the temperature of 25° C. is increased by 10° C. to 35° C., and voltages are supplied up to 3V by being sequentially increased by 0.1V. Whenever each voltage is increased by 0.1V, each current (I) is measured. Based on the measured voltages and currents, resistance values are obtained. Then, an average of the resistance values (e.g., R2) is calculated (SB11).

Then, the present temperature is sequentially increased by 10° C. up to 90° C., and averages of resistance values (R3~R8) are obtained at each temperature.

Then, based on the temperature difference and the resistance values, a thermal resistance coefficient (αt1) is obtained as the following equation 2 (SB12).

$$\alpha_t = \frac{\left(\frac{R_2 - R_1}{t_2 - t_1}\right)}{R_1}[\#/^\circ \text{C.}] \qquad \text{[Equation 2]}$$

Here, 't1' indicates 25° C., 't2' indicates 35° C.°, R1 indicates an average of resistance values obtained at 25° C., R2 indicates an average of resistance values obtained at 35° C., and '#' indicates a result value of the thermal resistance coefficient (αt)

For your reference, the larger the average of the respective resistance values is, the more the resistance values change according to temperature changes. Therefore, it is not preferable to obtain a large average of the respective resistance values, that is, a large thermal resistance coefficient (αt)

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A process condition evaluation method for a liquid crystal display module (LCM), comprising:

a first step of obtaining a threshold power measuring pattern, an analysis sample for a cell bonding status in an LCD fabrication process, and obtaining a lower substrate sample by separating an upper substrate from the threshold power measuring pattern;

a second step of supplying voltages on a gate pad on the lower substrate sample with sequentially increasing a voltage level by a predetermined unit by using an electrical device, and obtaining a threshold current and a threshold voltage by measuring currents at a drain pad whenever voltage increased by a predetermined unit is applied to the gate pad; and a third step of obtaining threshold power based on the threshold current and the threshold voltage, and thereby evaluating process conditions of the LCM.

2. The method of claim 1, wherein if the first step is completed when a cell rather than a thin film transistor (TFT) is completed, further comprising:

removing an alignment layer from the lower substrate sample, and performing an annealing process.

3. The method of claim 2, wherein the alignment layer is removed by a PI stripper, the PI stripper is removed by deionized water (DI), and the DI is removed by an air gun.

4. The method of claim 2, wherein the annealing process is performed for 30 minutes in an oven of 180° C.

5. The method of claim 1, wherein the threshold power is obtained by using a following equation 1 of '$P=(I\times V)/2$', in which 'I' indicates the threshold current, and 'V' indicates the threshold voltage.

* * * * *